United States Patent
Monro

(10) Patent No.: US 7,511,638 B2
(45) Date of Patent: *Mar. 31, 2009

(54) DATA COMPRESSION FOR COMMUNICATION BETWEEN TWO OR MORE COMPONENTS IN A SYSTEM

(76) Inventor: Donald M. Monro, 6, The Lays, Goose Street, Beckington, Somerset, United Kingdom (GB) BA11 6RS ( * ) Notice: Subject to any disclaimer, the term of this patent is extended or adjusted under 35 U.S.C. 154(b) by 0 days.

This patent is subject to a terminal disclaimer.

(21) Appl. No.: 11/777,022

(22) Filed: Jul. 12, 2007

(65) Prior Publication Data

US 2009/0015441 A1    Jan. 15, 2009

(51) Int. Cl.
*H03M 7/34* (2006.01)

(52) U.S. Cl. .................. 341/51; 341/87; 341/106; 341/107

(58) Field of Classification Search .......... 341/51, 341/87, 106; 707/100, 101; 708/203
See application file for complete search history.

(56) References Cited

U.S. PATENT DOCUMENTS

| | | | |
|---|---|---|---|
| 4,168,513 A | 9/1979 | Hains et al. | |
| 4,509,038 A | 4/1985 | Hirano | |
| 5,635,932 A * | 6/1997 | Shinagawa et al. | 341/51 |
| 5,748,786 A | 5/1998 | Zandi et al. | |
| 5,768,437 A | 6/1998 | Monro et al. | |
| 6,078,619 A | 6/2000 | Monro et al. | |
| 6,549,148 B2 * | 4/2003 | Satoh | 341/51 |
| 6,556,719 B1 | 4/2003 | Monro | |
| 6,563,438 B2 * | 5/2003 | Satoh | 341/51 |
| 6,714,147 B2 * | 3/2004 | Huber et al. | 341/51 |
| 6,990,145 B2 | 1/2006 | Monro et al. | |
| 7,310,055 B2 * | 12/2007 | Odagiri | 341/51 |
| 2004/0126018 A1 | 7/2004 | Monro | |
| 2004/0165737 A1 | 8/2004 | Monro | |

FOREIGN PATENT DOCUMENTS

| | | |
|---|---|---|
| WO | WO 99/08449 | 2/1999 |
| WO | WO 01/63935 | 8/2001 |

* cited by examiner

*Primary Examiner*—Khai M Nguyen

(57) ABSTRACT

Briefly, within a computer or digital data processing system, embodiments describe a method, article and apparatus for compressing data is described, which may be used for communicating between two or more components connected to an interconnection medium (e.g., a bus) within a single computer or digital data processing system, and/or for communicating between two or more computers or digital data processing systems via an interconnection medium such as a network.

37 Claims, 3 Drawing Sheets

DATA COMPRESSION FOR COMMUNICATION BETWEEN TWO OR MORE COMPONENTS IN A SYSTEM

FIELD

The present patent application is related to data compression, and, within a computer or digital data processing system, processes or apparatus for communicating between two or more components connected to an interconnection medium (e.g., a bus) within a single computer or digital data processing system. Subject matter disclosed herein may also relate to processes or apparatus for transferring data from one computer or digital processing system to another computer or digital processing system via a network or other interconnection medium.

BACKGROUND

In recent years it has become more and more common for persons to share data over networks; however, transmission of data has a cost in terms of bandwidth utilization. Therefore, large amounts of data, for example, are often compressed. Compression may also be used, for example, in storing data on magnetic or other media, in transferring data from one component to another within a computing platform, and/or in transferring data to and/or from a peripheral device to and/or from a computing platform.

BRIEF DESCRIPTION OF THE DRAWINGS

Subject matter is particularly pointed out and distinctly claimed in the concluding portion of the specification. Claimed subject matter, however, both as to organization and method of operation, together with objects, features, and advantages thereof, may best be understood by reference to the following detailed description if read with the accompanying drawings in which:

DETAILED DESCRIPTION

Figure 1:
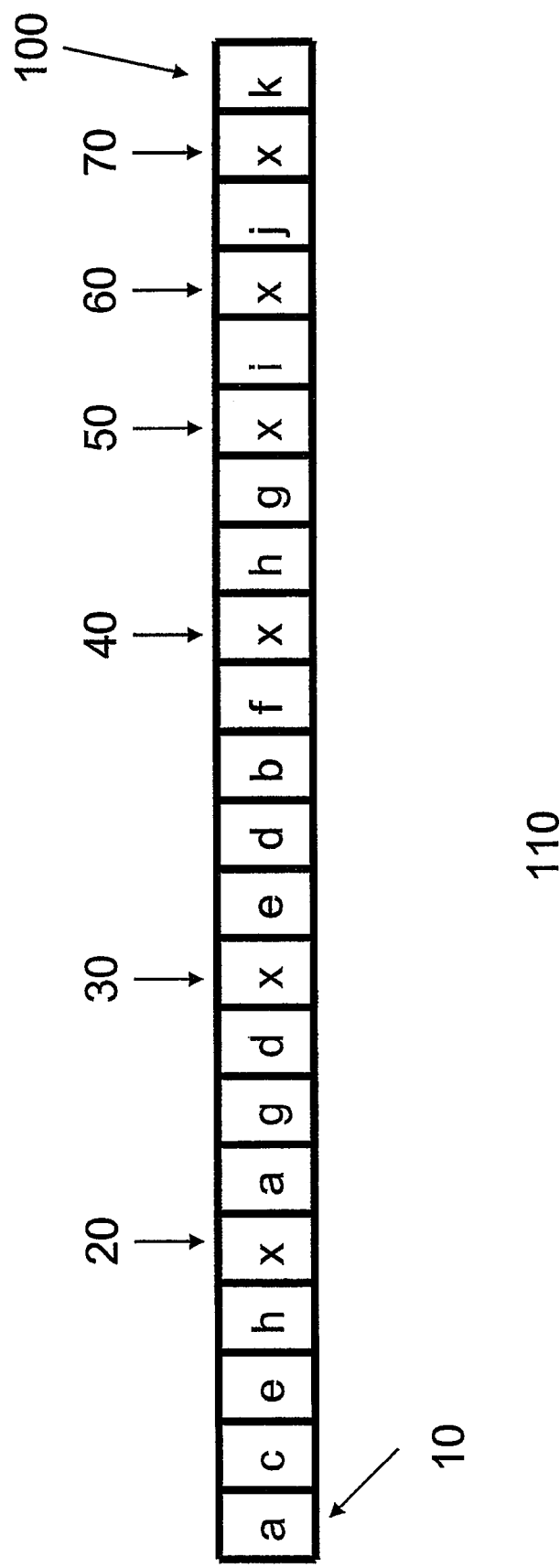
FIG. 1 is a schematic diagram illustrating one example embodiment in accordance with claimed subject matter.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Some portions of the detailed description which follow are presented in terms of algorithms and/or symbolic representations of operations on data bits and/or binary digital signals stored within a computing system, such as within a computer and/or computing system memory. These algorithmic descriptions and/or representations are the techniques used by those of ordinary skill in the data processing arts to convey the substance of their work to others skilled in the art. An algorithm is here, and generally, considered to be a self-consistent sequence of operations and/or similar processing leading to a desired result. The operations and/or processing may involve physical manipulations of physical quantities. Typically, although not necessarily, these quantities may take the form of electrical and/or magnetic signals capable of being stored, transferred, combined, compared and/or otherwise manipulated. It has proven convenient, at times, principally for reasons of common usage, to refer to these signals as bits, data, values, elements, symbols, characters, terms, numbers, numerals and/or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing", "computing", "calculating", "determining" and/or the like refer to the actions and/or processes of a computing platform, such as a computer or a similar electronic computing device, that manipulates and/or transforms data represented as physical electronic and/or magnetic quantities and/or other physical quantities within the computing platform's processors, memories, registers, and/or other information storage, transmission, and/or display devices.

Although claimed subject matter is not limited in scope in this respect, one particular embodiment of a method of compressing data is described hereinafter. A symbol string may be selected that occurs within a set or grouping of data to be compressed. A symbol string code may be generated indicative of one or more positions of the symbol string within the data. A further symbol string code may carry the position beyond the end of the data, indicating that a new symbol string is to be selected and coded, the first position of which is given by the number of positions beyond the end of the data. Respective symbol string codes may be combined to form a data code. A resulting data code may comprise a compressed form of the set or grouping of data. This data code may be transmitted or stored as desired.

Although claimed subject matter is not limited to this embodiment, one particular embodiment may be carried out by compressing data according to "Multipass Embedded Residual Group Encoding" ("MERGE") data compression methods, but without employing End of Group (EOG) symbols at the end of every symbol string coded. One manner of accomplishing this is that a symbol string may be selected and its positions signalled. This may, for example, be done by run length coding the distance between positions. However, when the final position is reached, the positional coder carries on past the end of the data and back to the beginning, i.e. it wraps around. This may be done by a distance usually signalled by a run length code. In an embodiment, the distance may be large enough that it wraps around more than once. Though, claimed subject matter is not limited to this embodiment and wrap around may be done in various manners, as discussed in examples below.

One particular embodiment may be carried out by successively identifying positions at which a selected symbol string occurs, determining distances between occurrences of the selected symbol string, and generating a code including distances representing the positions of the selected string within the data, although claimed subject matter is not limited in scope in this respect. A position beyond the end of the data may indicate that a new symbol string is to be selected and coded, whose first position is indicated by the distance of the position beyond the end of data. Symbols may comprise any type, form or format of data. For example, this may include records, files, sectors, clusters, groupings and/or portions thereof. Furthermore, symbols may comprise words, bytes, bits, text, characters and/or the like. Symbol strings may comprise single or multiple symbols. Likewise, they may be fixed or variable in length.

For one particular embodiment, symbol strings may be coded in a particular or a predetermined order, although, again, this is merely an example embodiment and claimed subject matter is not limited in scope in this respect. Alternatively or in addition, rather than coding in an order, symbol strings may be coded in any order. In such an embodiment a symbol string code may be prefixed by some other code indicative of the particular symbol string, for example, although claimed subject matter is of course not limited in scope to this example embodiment. Likewise, for one particular embodiment, the approach employed may be switchable between modes, such as a mode in which symbol string codes are transmitted or stored in a predetermined order, and a mode in which the order is not predetermined, but in which, in this latter mode, some code representative of a corresponding symbol string is sent before or as part of a symbol string code.

In one embodiment, if a symbol string includes repetitions of a symbol string, a symbol string code may include data which indicates presence of a run of occurrences of the symbol string. Storage or transmission of data indicative of a run of occurrences may be more efficient from a compression standpoint than sending such occurrences individually. In one particular embodiment, positions may be signalled by run length coding, but other coding methods are also possible instead or in addition, as described in more detail below. Likewise, coding may be context dependent at least in part. If a length of a set or grouping of data to be coded is known in advance, for example, it may be prefixed to a first symbol string code. Depending at least in part on the particulars of an embodiment, positions of a final symbol string may be determined without transmission or storage of additional information corresponding to that particular symbol string, again as described in more detail below.

However, in another embodiment, the position of the symbol string may be signalled by indicating where it does not occur, although, again, this is merely an example embodiment and claimed subject matter is not limited in scope in this respect. For example, by sending the distance between occurrences and ignoring what might actually lie in between.

If a symbol string occurs infrequently, a symbol string code may include data which indicates a run of positions or vacancies where the symbol string does not occur. Storage or transmission of data indicative of a run of vacancies may typically be more efficient from a compression standpoint than sending such occurrences individually. In one particular embodiment, vacancies may be signalled by run length coding, but other coding methods are also possible instead or in addition, as described in more detail below. Likewise, coding may be context dependent at least in part. If a length of a set or grouping of data to be coded is known in advance, for example, it may be prefixed to a first symbol string code. Depending at least in part on the particulars of an embodiment, positions of a final symbol string may be determined without transmission or storage of additional information corresponding to that particular symbol string, again as described in more detail below.

Furthermore, side or additional information about all or some symbol strings may also be included in a data code. In one particular embodiment, additional information relating to a particular symbol string may be sent at the end of or otherwise associated with a corresponding symbol string code. Alternatively, additional information may be sent or stored after sending or storing symbol string codes. More generally, additional information may be provided at any time or in any manner so that a decoder is capable of associating that information with a corresponding symbol string. A list or table of symbol strings to be used may be predetermined or predefined, for example. Alternatively or in addition, it may be compiled based at least in part on symbol strings which occur in data to be compressed, for example.

After symbol string codes for a particular set or grouping of data have been stored or transmitted, an end code may be used. After positions of symbol strings present in a set of data, except a final symbol string, have been stored or communicated, positions of the final symbol string may, in at least some embodiments, be determined. Hence, an encoder may omit storing or communicating positions of such a final symbol string, as described in more detail hereinafter.

However, in this application, it is shown how the end code may be avoided. As is known in the field, it may be beneficial to reduce the number of symbols used in forming a code, so eliminating the symbol used to indicate the end of a group may result in improved compression. This may be useful when the data is such that most symbol strings occur, and the distribution of any given symbol string throughout the data is relatively uniform, i.e. there is no bias towards the beginning or end of the data.

Embodiments covered by claimed subject matter include, for example, a computer program capable of implementing any such method, and/or a computer system capable of implementing such a method. Embodiments also include a hardware and/or software coder capable of carrying out a method as described below in combination with a hardware and/or software decoder capable of reconstructing an original set or grouping of data from a data code representing a compression of such data. These as well as many other embodiments are intended to be within the scope of claimed subject matter.

In at least some embodiments described, compression is lossless, although claimed subject matter is not limited in scope in this respect. For example, in some embodiments, a data code may include information on positions of those symbol strings contained within the data to be compressed.

In this particular context, any grouping, set or portion of associated data to be compressed may be treated as an ordered sequence of characters or other symbols. If such data is representative of text, for example, individual symbols may comprise one or more text characters, but that is, of course, not essential. Many other symbols may also be represented. More generally, symbols may be presented by bytes or other sized groupings of data. It is also possible that longer or short portions of data could be used, which may or may not fit within a byte or digital word length, for example. If data is represented in binary form, a symbol may be represented, depending on the particular embodiment, as a single bit or multiple bits of fixed or variable length.

Data, such as stored as a file, a record or other unitary association of data, as one example, might be treated as a whole, or instead partitioned or divided into convenient lengths, long enough for symbol groupings, referred to herein as symbol strings, to be coded with some amount of compression efficiency, but short enough to be conveniently processed. Various approaches are described in more detail below.

Initially, for example, in an embodiment, a list or table of symbol strings that may occur within a set of data is established. Added to this list might be an initial list of symbol strings based at least in part on a priori knowledge or information regarding statistics for the data. For example, for text, a common symbol string might comprise "ee", frequently occurring words such as "and" or "or", or a punctuation symbol followed by a blank, to provide some simple examples. Of course, claimed subject matter is not limited in scope to these examples or to this particular embodiment. Many possible variations are also intended to be included within the scope of claimed subject matter.

A particular set of data, as another example, may be examined before coding begins to identify symbol strings that occur commonly. Alternatively, or in addition, if partitioning is applied, these partitions, for example, may be handled separately or independently using an initial list of symbol strings. This initial list may be determined, for example, at least in part from symbol strings which may have been found in earlier data partitions, for example.

Alternatively, symbol strings may be added as coding proceeds, as occurs in Lempel-Ziv-Welsh coding, as an example. However, in this embodiment example, coding symbol strings, as described below, is quite different from the approach used in LZW coding. In LZW, a symbol string is coded by substitution of another, longer symbol or string. For that reason, LZW may, at times, not compress sets of data and, in some cases, may produce longer sets of data. In contrast, embodiments in accordance with claimed subject matter will likely result in compression, as described in more detail hereinafter.

To compress a grouping or a set of data, a first symbol string may be selected from a list of available symbol strings. Occurrences of that string in the data may be located. Positions of the first symbol string within the data may be retained. This process may be repeated for additional symbol strings for the data so as to specify the set or grouping. Data comprising symbol strings may be processed in any order, although sequentially from beginning to end of the set or grouping of data may be one convenient approach.

Typically, coding is carried out by a hardware or software coder. In one possible embodiment, a coder may be arranged to transmit data, after being coded, across a communications channel to a decoder which may be arranged, in real time or otherwise, to use received coded data to reconstruct the set of data.

Again, claimed subject matter is not limited in scope to a particular embodiment. Therefore, the embodiments described previously or hereinafter are intended simply as examples for purposes of illustration. Many other approaches and/or embodiments are intended to be included within the scope of claimed subject matter other than these specific examples. Nonetheless, continuing with these examples, reference is now made to FIG. 1. FIG. 1 is a schematic diagram of an example embodiment in accordance with claimed subject matter.

In the example of FIG. 1, one line of text 110 is illustrated to represent a set or grouping of data. Likewise, a symbol string, here, the letter "x," will be processed in this example. Of course, claimed subject matter is not limited to this example embodiment or to any one particular embodiment. This example is simply an illustration for explanatory purposes. Many other potential embodiments are intended to be included within the scope of claimed subject matter.

Starting at a location, referred to here as "start," designated in FIG. 1 as 10, text data 110 is searched sequentially in this example. Of course, claimed subject matter is not limited to sequential searching, as mentioned previously, above. Nonetheless, if an occurrence of a selected symbol string, here, again, "x," is found, information about the occurrence, such as, in this example, its location, may be retained. In the example shown, the first occurrence of the string "x" occurs in the $5^{th}$ position after start position 10, as is indicated by reference numeral 20. Symbol string "x" is again at position nine after the start, or four positions further on from the preceding one, as is indicated by reference numeral 30.

Continuing with the example, "x" occurs again five positions later, after the preceding one, as shown by reference numeral 40. Subsequent positional spacing is 3, 2, 2, as respectively shown by reference numerals 50, 60, 70.

In this example, once text data 10 has been fully parsed in this way to an "end" position, here 100, a code representative of positions in the portion of the set of data is generated by storing or transmitting this code. Though, a code representative of positions in the portion of the set of data may also be generated without storing or transmitting this code in other embodiments. In this particular embodiment, in effect, positions at which x does not occur are stored or signalled. In this context, this is referred to as run length coding. Here, "runs" of positions not containing x are coded.

In the simple example embodiment of FIG. 1, data comprises a line of text and the symbol string comprises a letter. In variants of this within the scope of claimed subject matter, occurrences of more lengthy and/or complex symbol strings may be sought. As described in more detail below, these may comprise symbol strings having a fixed, predefined form, or alternatively, may comprise symbol strings having flexibility, such as, in form, length, and/or composition, for example. The extent of flexibility may be predefined or it may be calculated with some dependence at least in part upon some characteristic or characteristics of the data. Some further example symbol strings are set out below.

Any letter, symbol or character a, such as "x". This could in principle include a single symbol position.

Any bigraph $a_1 a_2$, such as "st".

Any combination $a_1 a_2 a_3$, such as "str".

Any longer combination $a_1 a_2 a_3 \ldots a_n$, such as "st _ _ ng" where the underscores represent single symbol positions.

For an embodiment, once positions of a first symbol string have been determined, positions of a second symbol string in a list of possible or known symbol strings may be determined.

In this embodiment, a further run of positions not occupied by either symbol may be sent which carries the position beyond the end of the data and by starting again at the beginning moves forward to the first position of the second symbol string. More detail is given in examples which follow. The coding of positions may or may not skip over positions whose symbols are already known as explained in more detail in the examples below.

Gradually, in this manner, a set of data may be coded. As coding proceeds, a coder may transmit to a decoder information about symbol strings that have been located, such as position(s), in real time for some embodiments. Alternatively, coded data may be stored locally as a compressed representation.

The example embodiment may be expressed in pseudo-code as follows:

For S=Symbol Strings
   Indicate positions of S in a set of data
End

As a further example, consider a short sequence S of 8 symbol strings S1 to S8. For purposes of illustration, symbol strings here comprise a fragment of text, although claimed subject matter is not limited in scope in this respect. Such fragments are short and, furthermore, symbol strings may not comprise text at all and still be within the scope of claimed subject matter. A space between the two words also comprises a symbol string in this example, as illustrated below:

S: 'the test'

| S1 | S2 | S3 | S4 | S5 | S6 | S7 | S8 |
|----|----|----|----|----|----|----|----|
| t  | h  | e  | 'space' | t | e | s | t |

In this example, positions of a symbol string may be indicated by any convenient approach. A convenient approach to communication or transmit positions may comprise plain numerals. A set of symbol strings may be evaluated with respect to a set of data in some order. Suppose, for the purposes of illustration, as an example, symbol strings here have the order: 'e' 't' 's' 'h' 'space', although, of course, claimed subject matter is not limited in scope to this example or to any particular example. Nonetheless, for this example, the following symbol strings may be communicated or stored as follows:

| 3 6 | 1 5 8 | 7 | 2 | 4 |
|---|---|---|---|---|
| Scan for e | Scan for t | Scan for s | Scan for h | Scan for 'space' |

In the above, 3 and 6 indicate the position of symbol string 'e'; 1, 5 and 8 indicate the position of 't' and so on.

For this particular embodiment, a technique may be used advantageously to indicate no additional information for a particular symbol string is communicated or stored. In an embodiment, this may be accomplished by defining a special symbol for End Of Group (EOG). This would give, for this example embodiment:

| 3 6 EOG | 1 5 8 EOG | 7 EOG | 2 EOG | 4 EOG |
|---|---|---|---|---|
| Scan for e | Scan for t | Scan for s | Scan for h | Scan for 'space' |

However, more efficient coding of position may be advantageous. For example, with eight positions, 3 bits per symbol string may be employed to communicate position by a conventional coding method, quite apart from communicating an EOG.

To improve compression efficiency, Run Length Coding (RLC) may be applied to the positions of successive symbol strings. However, any form or type of coding to code the length of a run might be used and claimed subject matter is not limited to a particular form or type. For example, a Golomb coder, or a binary arithmetic coder might be employed, to provide a few examples. These coders may be employed, for example, to code a succession of 0's and 1's that indicate one or more positions in a set of data where a symbol string does not and does occur (or vice versa). Of course, these are simply examples and claimed subject matter is not limited in scope to such examples. Many other possible approaches to coding the length of runs are contemplated and included within the scope of claimed subject matter.

Nonetheless, continuing with this example, in such an embodiment the positions of a symbol string may be run length coded. In this case, for example, instead of coding 3 followed by 6 to indicate positions of symbol string 'e', one may code a 2 to indicate that 2 positions are skipped before the first occurrence of 'e', 2 to indicate that two further positions are skipped to get from position 3 to position 6, and so on:

| 2 2 EOG | 0 3 2 EOG | 6 EOG | 1 EOG | 3 EOG |
|---|---|---|---|---|
| Scan for e | Scan for t | Scan for s | Scan for h | Scan for 'space' |

This provides compression by involving the 6 symbols 0, 1, 2, 3, and 6 in addition to EOG, which is a smaller set to code than the 9 symbols 1 to 8 plus EOG.

In this example, to eliminate the EOG symbol, it is noticed that the final position of 'e' is 6 and the first position of t is 1. Coding a run length of 2 following the final 'e' may at first sight seem impractical or impossible because by signalling that position 8 is to be passed, it carries the data to position 9 in a data set that has only 8 positions, but in this example we interpret 9 as being the same as 1, i.e. the beginning of the data which is the first position of 't'. More generally, in this example, whenever we signal a run length r, which causes r+1 to be added to a current positions, knowing that the length of the data is L, we may interpret the new position not simply as p+r+1 but instead as mod (p+r+1,L), i.e. the integer remainder after p+r+1 is divided by L. If p+r+1 is less than or equal to L this is the same as p+r+1. If p+r+1 is greater than L this 'wraps around' back into the data set. In this example we assume the 'wrap' re-enters the data once only, but for a large value of r, it might wrap around more than once. For example, this may be used to indicate that one or more symbol strings are to be skipped over in an embodiment where the order of symbol strings is predetermined. For example, a run of 11 after 6 will also move to position 1, but by passing once completely over the data which might indicate that a symbol string is to be jumped. When p+r+1 is greater than L, the number of wraps would be the integer quotient:

$$int\left(\frac{p+r}{L}\right)$$

And the number of symbol strings jumped past or 'passed over' is one less than this, i.e.:

$$int\left(\frac{p+r}{L}\right)-1$$

It may be noted that the new position reached in this example is mod (p+r+1, L) as previously stated. Of course, claimed subject matter is not limited to this example embodiment or to any one particular embodiment. This example is simply an illustration for explanatory purposes. Many other potential embodiments are intended to be included within the scope of claimed subject matter.

Yet, continuing with this example, we will see below that L may be interpreted differently in another embodiment of the method. It is possible that when a wraparound occurs, the decoder may not know what the next symbol string is to be. For example, this may happen if the sequence of symbol strings to be coded has not been predetermined. The identity of the new symbol might be coded as soon as the wraparound occurs. This however is but one possibility and the claimed method is not to be limited in this respect. For example, the entire communication could be carried out without knowing what the symbol strings are, by the decoder simply assigning its own choice of temporary tokens to be substituted with actual symbol strings at some future time.

Assuming the sequence of symbols is known as in the example, then the current example can be continued to show how wraparound would be used with run length coding:

| 2 2 | 2 3 2 | 6 | 3 | 9 |
|---|---|---|---|---|
| Scan for e | Scan for t | Scan for s | Scan for h | Scan for 'space' |

It is noted that to force a new symbol string to be selected, the position goes beyond the end of the data, even though the first occurrence of the new symbol string may occur before the end of the data. In the above example this occurs for the t and 'space' symbols. For example, although 'space' occurs two symbols beyond h, to force a wraparound a run of 9 position skipped may be utilized.

However, compression may be improved still further by an embodiment analogous to "significance switching." More specifically, here, for each successive symbol string that is coded, positions to be coded become fewer as more and more symbol strings become determined by position. This additional information regarding position may be employed to provide additional compression.

In the present example, as the positions of symbol string 'e' become known, for example, these positions may be omitted as possible positions for later symbol strings. In effect, for the purpose of coding, how many unknown positions are to be skipped is coded, rather than total positions to be skipped, thereby providing additional compression. Without Run Length Coding or Wraparound, in this example, this may be:

| 0010 0100 | 10x0 1x01 | x0x0 xx1x | x1x0 xxxx | xxx1 xxxx |
|---|---|---|---|---|
| Scan for e | Scan for t | Scan for s | Scan for h | Scan for 'space' |

In this particular embodiment, the symbol x here indicates a position that is already known and so does not have to be signalled. The total number of '0''s and '1''s is reduced, from 40 to 20.

However, for an embodiment comprising a Run Length Code including Wraparound this may be further reduced. For increased efficiency, in the formulas given previously, the data length L may be interpreted as being the number of data symbols in the data grouping that have not yet been coded. To specify the positions of 'e', the run length coding (RLC) is the same because no positions are known beforehand. However in coding 't', positions containing 'e' may be omitted since they are already occupied, so these do not have to be counted in the RLC for the purpose of coding and/or decoding. In coding 's' the position is already at the end of data, so the first RLC of 2 wraps it around immediately, skipping past the as yet uncoded positions of 'h' and 'space' to reach the position of the 's'. The coding of 's' has reached the end of the unknown part of the data so a run of 0 skips no unknown positions, i.e. goes directly to 'h'. A run of 1 then wraps around the end of the data to the next available position for 'space'. The code, using run length coding between positions may be:

| 0010 0100 | 10x0 1x01 | x0x0 xx1x | x1x0 xxxx | xxx1 xxxx |
|---|---|---|---|---|
| Scan for e | Scan for t | Scan for s | Scan for h | Scan for 'space' |
| 2 2 | 2 2 1 | 2 | 0 | 1 |
| Scan for e | Scan for t | Scan for s | Scan for h | Scan for 'space' |

In this particular embodiment, the number of different symbols used has been reduced even further, to 0, 1, and 2.

Furthermore, once the coder comes to the final symbol string to be coded, its positions may be determined without communicating or coding any additional information. More specifically, in this example embodiment, this symbol string may occupy positions not previously signalled or coded. However, this assumes the length of the set of data being coded is known. If so, after 'h' is finished, all remaining symbol strings in this example are implicitly 'space' and the process may terminate without additional coding or communication. In the given example, therefore, assuming it is known that 'space' is the final symbol string, the code may be:

| 2 2 | 2 2 1 | 2 | 0 | 1 |
|---|---|---|---|---|
| Scan for e | Scan for t | Scan for s | Scan for h | Skip to end 'space' |

Which in this particular example is the same symbol stream, but may be interpreted differently by the decoder.

However, it may also be advantageous in some circumstances to employ a similar approach if the length of a set of data and/or number of symbol strings is not known. Various approaches are possible in situations where the length of a set of data being coded, for example, is not known and claimed subject matter is not limited in scope to a particular approach. For example, this might be handled by having a standard length. Alternately, length information may be prefixed to coded information. However, if multiple sets of data are being coded and most have the same length, to prefix length would be inefficient from a compression standpoint. Likewise, continuing with this notion, for a long communication of data, if a standard length is employed to sub-divide the data, variation from a standard length may be handled by communicating or coding a set of data at the end smaller than the standard length.

One example embodiment of a method may include partitioning the total length of a data set before coding. If there is a standard partition length, the coder and decoder may determine how many partitions there are, and the length of final partition if it is less than the standard length. For example, if a set of data that is 102 symbol strings long is being coded and the standard length of a partition is 5, then 21 partitions are present with the final one having a length of 2. Again, as previously alluded to, the total length may be included in the data code in many ways and the examples given are not intended to be restrictive. Claimed subject matter is intended to include these example approaches as well as other possible approaches.

Likewise, several approaches are also possible with respect to handling symbol strings. For example, as previously illustrated, a predetermined order of symbol strings may be employed. However, alternately, symbol strings may be ordered relative to their frequency of occurrence if known or capable of being determined or approximated. For example, using the English language simply as an example, this might be the following symbol string order: 'e' 't' 'a' 'o' 'i' 'n' 's' 'h' and so on. A "space" may be included in such an order as its statistics indicate in a sample. Also, there may be symbol strings that do not occur, which may form an empty group to be signalled. With such an approach, both the coder and the decoder have an order of symbol strings. Accordingly, if a decoder receives a position that implies a wraparound, or a multiple wraparound, for example, it is able to determine the next appropriate symbol string.

Another approach in another embodiment may be explicitly to prefix a set of data, for example, with a symbol string. Likewise, a symbol string may alternately be post-fixed or otherwise embedded so that a decoder may make appropriate determinations from coded data. It is likewise possible that a system may employ two modes, one in which a predetermined order of symbol strings is communicated and another in which symbol strings are prefixed or otherwise embedded. These modes may occur in any order and mode switching may be indicated, in one example, by a special symbol used for that purpose.

In still another possible embodiment, a coder and decoder may adopt a method of constructing new symbol strings from symbol strings already received. This level of flexibility may permit an encoder to select or change symbol strings and modes of communication to improve compression. For example, it might well be the case that not all predefined symbol strings are used, in which case, to avoid signalling a large number of empty groups by a large number to wrap-around, i.e. a multiple passover, there might be a new symbol string which signals No More Groups, effectively meaning End of Data Set or End of Data, for example.

In many situations, side information might accompany a data set. For example, in the case of text, such side information may comprise font, size, weight, color and/or style. The side information may be communicated or coded any number of ways. For example, side information may be embedded with a run length, or inserted in coded data in any position so that a decoder may appropriately associate it with a symbol string. In one embodiment, it might be desirable to handle side information combined with a symbol string as a symbol string itself, hence forming additional groups. For example, an italic 'e' may form a separate symbol string from normal 'e', as one simple example. Likewise, in an embodiment, a special symbol may be employed to switch between different embedding styles or approaches.

Figure 2:
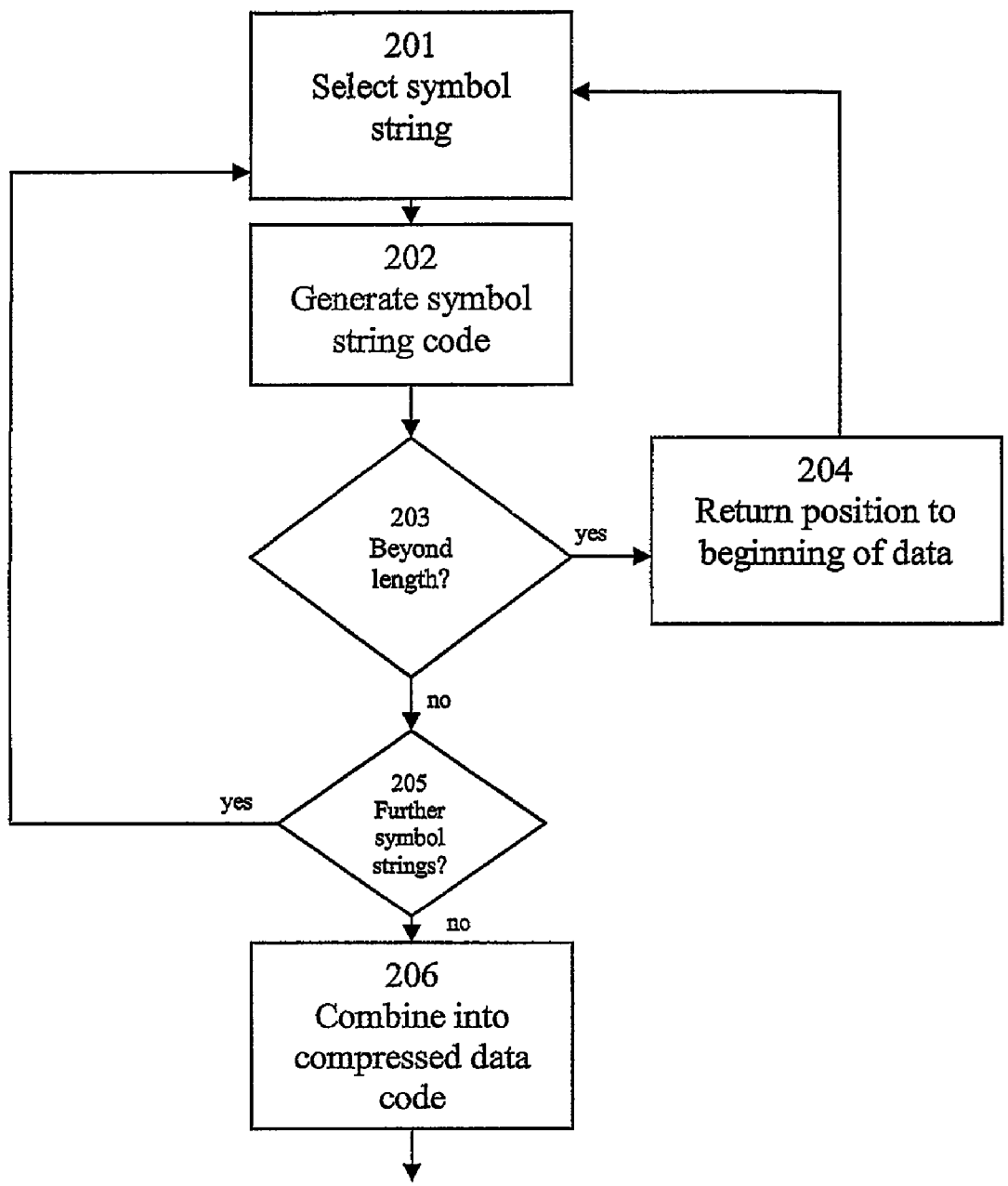
FIG. 2 is a flow chart illustrating an example embodiment of a method for coding data in accordance with claimed subject matter.

FIG. 2 is a flowchart depicting an example embodiment. At 201, a symbol string that occurs within the data to be compressed may be selected. At 202, a symbol string code indicative of one or more positions of the symbol string within the grouping of data to be compressed may be generated. A determination may be made at 203 that if the symbol string code indicates a position beyond the length of the data, at step 204 the position is returned to the beginning of the data, at least partially in response to the symbol string code, and at 201, a new symbol string may be selected with a first position of the new symbol string determined based at least in part upon a length of the data and the position. If at 203 the symbol string code does not indicate a position beyond the length of the data, processing may proceed to 205. At 205, a determination may be made as to whether there are further symbol strings that occur within the grouping, and returning to 201, successively repeating the process until there are no further symbol strings. At 206, the respective symbol string codes may be combined into a compressed data code. An embodiment in accordance with claimed subject matter may include all, more than all or less than all of blocks 201-206. Furthermore, the order of blocks 201-206 is merely one example order, and the scope of the claimed subject matter is not limited in this respect.

Of course, claimed subject matter is not limited to the example in FIG. 2 or to any one particular embodiment. This example is simply an illustration for explanatory purposes. Many other potential embodiments are intended to be included within the scope of claimed subject matter.

Embodiments in accordance with claimed subject matter may be applied to coding of data of all types, including non-numeric data, such as symbolic data, for example, converted into numerical form by any convenient mapping prior to application of coding. As is noted, embodiments perform well for run length coding, although it will, of course, be understood that claimed subject matter is not limited to that application. It is intended that embodiments of claimed subject matter be applied to any one of a number of different types of data coding. Therefore, claimed subject matter is not intended to be limited in terms of the type of data to which it may be applied.

It is noted, of course, that claimed subject matter is not limited to particular embodiments. Therefore, in addition to covering methods for coding and/or decoding of data, claimed subject matter is also intended to cover, for example, software incorporating such methods and to coders and/or decoders (whether implemented in hardware or software, or a combination of hardware and software). Claimed subject matter is also intended to include a video or audio codec embodying such methods and/or a video or audio compression system whereby data may be encoded according to a method as described or claimed. For example, embodiments may include transmitting data across a communications channel for reconstruction by a decoder at the far end. Likewise, alternatively, in another embodiment in accordance with claimed subject matter coded data may be stored rather than transmitted. Thus, claimed subject matter is intended to cover these as well as other embodiments.

Figure 3:
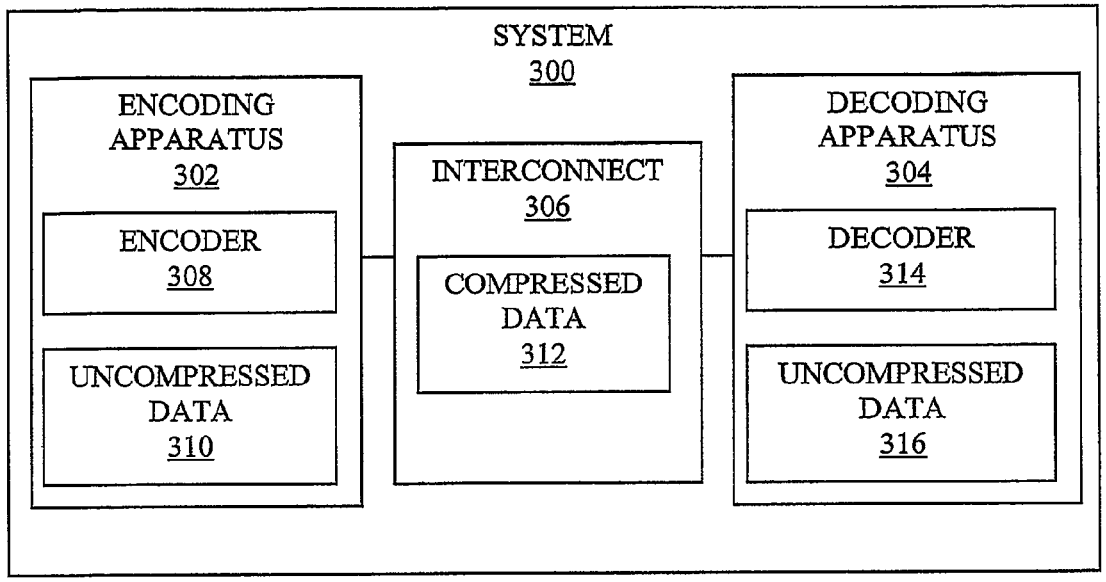
FIG. 3 is a block diagram illustrating an example embodiment of a system in accordance with claimed subject matter.

FIG. 3 is a block diagram illustrating an example embodiment of a system 300 comprising an encoding apparatus 302 and a decoding apparatus 304 in accordance with the claimed subject matter. In one embodiment, system 300 may include encoding apparatus 302, decoding apparatus 304 and an interconnect 306. Alternatively or additionally, communication may not be over interconnect 306. For example, system 300 may have encoding apparatus 302 and decoding apparatus 304 located within a single device and may perform communications within the device.

In one embodiment, encoding apparatus 302 may include an encoder 308 which may be capable of performing one or more example embodiments as described above and as illustrated in FIGS. 1 and/or 2. Encoder 308 may take uncompressed data 310 and encode it, or a portion of it, into compressed data 312. In one embodiment, encoding apparatus 302 may transmit compressed data 312 to decoding apparatus 304, such as within a single device, over a network, and/or the like.

In one embodiment, decoding apparatus 304 may include a decoder 314, which may be capable of performing the reverse of the example embodiments described above and illustrated in FIGS. 1 and/or 2. For example, decoder 314 may be capable of decoding data encoded according to one or more embodiments described above and illustrated in FIG. 2. Decoder 314 may take compressed data 312 and decode it, or a portion of it, into uncompressed data 316. System 300 described above is not limited to any particular hardware or software configuration and all or part of system 300 may find applicability in any computing or processing environment such as is described below in FIG. 4, for example.

Figure 4:
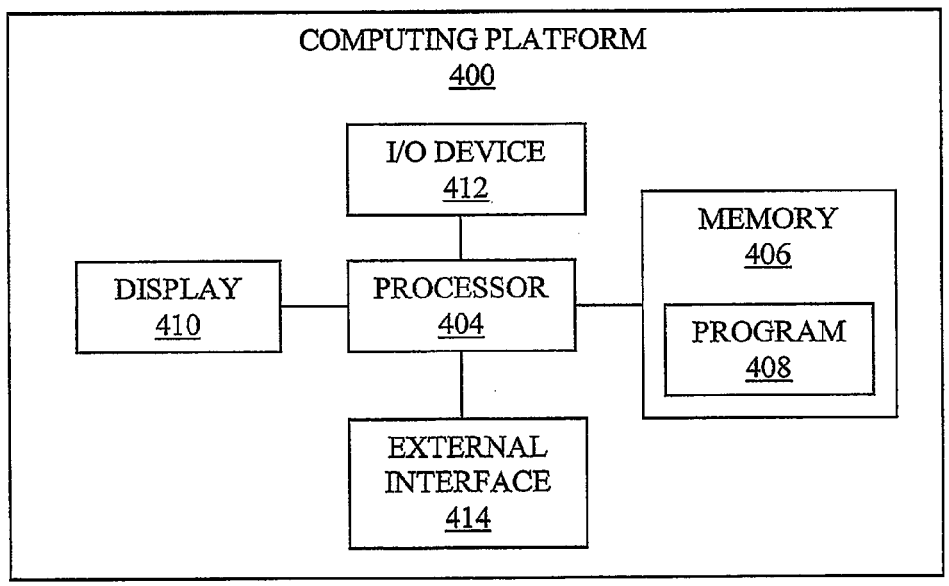
FIG. 4 is a block diagram of an example embodiment of a computing platform in accordance with claimed subject matter.

Referring to FIG. 4, a block diagram of an example embodiment of a computing platform 400 according to one or more embodiments is illustrated, although the scope of claimed subject matter is not limited in this respect. Computing platform 400 may include more and/or fewer components than those shown in FIG. 4. However, generally conventional components may not be shown, for example, a battery, a bus, and so on.

Computing platform 400, as shown in FIG. 4 may be utilized to embody tangibly a computer program and/or graphical user interface by providing hardware components on which the computer program and/or graphical user interface may be executed. Computing platform 400 may be utilized to tangibly all or a portion of FIG. 2 and/or other procedures disclosed herein. Such a procedure, computer program and/or machine readable instructions may be stored tangibly on a computer and/or machine readable storage medium such as a compact disk (CD), digital versatile disk (DVD), flash memory device, hard disk drive (HDD), and so on. As shown in FIG. 4, computing platform 400 may be controlled by processor 404, including one or more auxiliary processors (not shown). Processor 404 may comprise a central processing unit such as a microprocessor or microcontroller for executing programs, performing data manipulations, and controlling the tasks of computing platform 400. Auxiliary processors may manage input/output, perform floating point mathematical operations, manage digital signals, perform fast execution of signal processing algorithms, operate as a back-end processor and/or a slave-type processor subordinate to processor 404, operate as an additional microprocessor and/or controller for dual and/or multiple processor systems, and/or operate as a coprocessor and/or additional processor. Such auxiliary processors may be discrete processors and/or may be arranged in the same package as processor 404, for example, in a multicore and/or multithreaded processor; however, the scope of the scope of claimed subject matter is not limited in these respects.

Communication with processor 404 may be implemented via a bus (not shown) for transferring information among the components of computing platform 400. A bus may include a data channel for facilitating information transfer between storage and other peripheral components of computing platform 400. A bus further may provide a set of signals utilized for communication with processor 404, including, for example, a data bus, an address bus, and/or a control bus. A bus may comprise any bus architecture according to promulgated standards, for example, industry standard architecture (ISA), extended industry standard architecture (EISA), micro channel architecture (MCA), Video Electronics Standards Association local bus (VLB), peripheral component interconnect (PCI) local bus, PCI express (PCIe), hyper transport (HT), standards promulgated by the Institute of Electrical and Electronics Engineers (IEEE) including IEEE 488 general-purpose interface bus (GPIB), IEEE 696/S-100, and so on, although the scope of the scope of claimed subject matter is not limited in this respect.

Other components of computing platform 400 may include, for example, memory 406, including one or more auxiliary memories (not shown). Memory 406 may provide storage of instructions and data for one or more programs 408 to be executed by processor 404, such as all or a portion of FIG. 2 and/or other procedures disclosed herein, for example. Memory 406 may comprise, for example, semiconductor-based memory such as dynamic random access memory (DRAM) and/or static random access memory (SRAM), and/or the like. Other semi-conductor-based memory types may include, for example, synchronous dynamic random access memory (SDRAM), Rambus dynamic random access memory (RDRAM), ferroelectric random access memory (FRAM), and so on. Alternatively or additionally, memory 406 may comprise, for example, magnetic-based memory, such as a magnetic disc memory, a magnetic tape memory, and/or the like; an optical-based memory, such as a compact disc read write memory, and/or the like; a magneto-optical-based memory, such as a memory formed of ferromagnetic material read by a laser, and/or the like; a phase-change-based memory such as phase change memory (PRAM), and/or the like; a holographic-based memory such as rewritable holographic storage utilizing the photorefractive effect in crystals, and/or the like; and/or a molecular-based memory such as polymer-based memories, and/or the like. Auxiliary memories may be utilized to store instructions and/or data that are to be loaded into memory 406 before execution. Auxiliary memories may include semiconductor based memory such as read-only memory (ROM), programmable read-only memory (PROM), erasable programmable read-only memory (EPROM), electrically erasable read-only memory (EEPROM), and/or flash memory, and/or any block oriented memory similar to EEPROM. Auxiliary memories also may include any type of non-semiconductor-based memories, including, but not limited to, magnetic tape, drum, floppy disk, hard disk, optical, laser disk, compact disc read-only memory (CD-ROM), write once compact disc (CD-R), rewritable compact disc (CD-RW), digital versatile disc read-only memory (DVD-ROM), write once DVD (DVD-R), rewritable digital versatile disc (DVD-RAM), and so on. Other varieties of memory devices are contemplated as well.

Computing platform 400 further may include a display 410. Display 410 may comprise a video display adapter having components, including, for example, video memory, a buffer, and/or a graphics engine. Such video memory may comprise, for example, video random access memory (VRAM), synchronous graphics random access memory (SGRAM), windows random access memory (WRAM), and/or the like. Display 410 may comprise a cathode ray-tube (CRT) type display such as a monitor and/or television, and/or may comprise an alternative type of display technology such as a projection type CRT type display, a liquid-crystal display (LCD) projector type display, an LCD type display, a light-emitting diode (LED) type display, a gas and/or plasma type display, an electroluminescent type display, a vacuum fluorescent type display, a cathodoluminescent and/or field emission type display, a plasma addressed liquid crystal (PALC) type display, a high gain emissive display (HGED) type display, and so forth.

Computing platform 400 further may include one or more I/O devices 412. I/O device 412 may comprise one or more I/O devices 412 such as a keyboard, mouse, trackball, touchpad, joystick, track stick, infrared transducers, printer, modem, RF modem, bar code reader, charge-coupled device (CCD) reader, scanner, compact disc (CD), compact disc read-only memory (CD-ROM), digital versatile disc (DVD), video capture device, TV tuner card, touch screen, stylus, electroacoustic transducer, microphone, speaker, audio amplifier, and/or the like.

Computing platform 400 further may include an external interface 414. External interface 414 may comprise one or more controllers and/or adapters to prove interface functions between multiple I/O devices 412. For example, external interface 414 may comprise a serial port, parallel port, universal serial bus (USB) port, and IEEE 1394 serial bus port, infrared port, network adapter, printer adapter, radio-frequency (RF) communications adapter, universal asynchronous receiver-transmitter (UART) port, and/or the like, to interface between corresponding I/O devices 412. External interface 414 for an embodiment may comprise a network controller capable of providing an interface, directly or indirectly, to a network, such as, for example, the Internet.

It will, of course, be understood that, although particular embodiments have just been described, the claimed subject matter is not limited in scope to a particular embodiment or implementation. For example, one embodiment may be in hardware, such as implemented to operate on a device or combination of devices, for example, whereas another embodiment may be in software. Likewise, an embodiment may be implemented in firmware, or as any combination of hardware, software, and/or firmware, for example. Likewise, although claimed subject matter is not limited in scope in this respect, one embodiment may comprise one or more articles, such as a storage medium or storage media. This storage media, such as, one or more CD-ROMs and/or disks, for example, may have stored thereon instructions, that if executed by a system, such as a computer system, computing platform, or other system, for example, may result in an embodiment of a method in accordance with claimed subject matter being executed, such as one of the embodiments previously described, for example.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method comprising:
   generating a first symbol string code indicative of one or more first positions of a first symbol string within data to be compressed;
   generating a second symbol string code indicative of one or more second positions of a second symbol string within the data, wherein a first position of the second symbol string is determined based at least in part upon a length of the data and the first symbol string code; and
   combining the first symbol string code and the second symbol string code into a compressed data code.

2. The method of claim 1, wherein the first position of the second symbol string is determined by subtracting the length of the data from an end position indicated by the first symbol string code.

3. The method of claim 1, wherein the second symbol string is identified by repeatedly subtracting the length of the data from an end position indicated by the first symbol string code until a current position is within the length of the data.

4. The method of claim 1, wherein the length of the data comprises a total length of a data grouping that includes the data.

5. The method of claim 1, wherein the length of the data comprises a number of positions in the data which are not yet coded.

6. The method of claim 1, further comprising using run length coding to code the one or more second positions of the second symbol string.

7. The method of claim 6, wherein the run length coding comprises adaptive coding.

8. The method of claim 1, wherein the first symbol string and the second symbol string are coded in a predetermined order.

9. The method of claim 1, wherein the first symbol string code and the second symbol string code are stored or transmitted across a communications channel.

10. The method of claim 1, wherein the first symbol string includes repetitions of a symbol or a string, and further wherein the first symbol string code identifies a run of occurrences of said symbol or said string.

11. The method of claim 10, further comprising determining distances between occurrences of the first symbol string, wherein the first symbol string code identifies the one or more first positions of the first symbol string based at least in part on the determined distances.

12. The method of claim 1, wherein, in addition to the one or more first positions, the first symbol string code includes additional information corresponding to the first symbol string.

13. The method of claim 1, wherein the first symbol string data code includes the length of the data.

14. The method of claim 1, wherein the first symbol string code identifies one or more third positions where the first symbol string does not occur within the data.

15. The method of claim 1, wherein the length of the data to be compressed is predetermined and prefixed to the first symbol string code.

16. The method of claim 1, wherein the one or more positions of the first symbol string within the compressed data code are determined without transmission or storage of additional information corresponding to the first symbol string.

17. A computer-readable medium having stored thereon computer-readable instructions that, if executed, cause a computing device to:
   generate a first symbol string code indicative of one or more first positions of a first symbol string within data to be compressed;
   generate a second symbol string code indicative of one or more second positions of a second symbol string within the data, wherein a first position of the second symbol string is determined based at least in part upon a length of the data and the first symbol string code; and
   combine the first symbol string code and the second symbol string code into a compressed data code.

18. The computer-readable medium of claim 17, wherein said computer-readable instructions, if executed, further cause the computing device to subtract the length of the data from an end position of the first symbol string code to identify the first position of the second symbol string.

19. The computer-readable medium of claim 17, wherein said computer-readable instructions, if executed, further cause the computing device to repeatedly subtract the length of the data from an end position of the first symbol string code to determine at least a portion of the second symbol string code.

20. The computer-readable medium of claim 17, wherein the length of the data comprises a total length of a grouping in which the data is included.

21. The computer-readable medium of claim 17, wherein the length of the data comprises a number of positions in the data which are not yet coded.

22. The computer-readable medium of claim 17, wherein the one or more first positions of the first symbol string are run length coded.

23. The computer-readable medium of claim 17, wherein said computer-readable instructions, if executed, further cause the computing device to transmit the compressed data code across a communications channel.

24. The computer-readable medium of claim 17, wherein said computer-readable instructions, if executed, further cause the computing device to determine distances between occurrences of the first symbol string, wherein the first symbol string code is based at least in part on the distances.

25. An apparatus comprising:
   means for generating a first symbol string code indicative of one or more first positions of a first symbol string within data to be compressed;
   means for generating a second symbol string code indicative of one or more second positions of a second symbol string within the data, wherein a first position of the second symbol string is determined based at least in part upon a length of the data and the first symbol string code; and means for combining the first symbol string code and the second symbol string code into a compressed data code.

26. The apparatus of claim 25, wherein the first position of the second symbol string is determined by subtracting the length of the data from an end position of the first symbol string code.

27. The apparatus of claim 25, wherein the first position of the second symbol string is determined by repeatedly subtracting the length of the data from an end position of the first symbol string code until a current position is brought back within the length of the data.

28. The apparatus of claim 25, wherein the length of the data comprises a total length of a data grouping that includes the data.

29. The apparatus of claim 25, wherein the length of the data comprises a number of positions in the data which are not yet coded.

30. An apparatus comprising:

a computing platform, said computing platform being configured to generate a first symbol string code indicative of one or more first positions of a first symbol string within data to be compressed;

generate a second symbol string code indicative of one or more second positions of a second symbol string within the data, wherein a first position of the second symbol string is determined based at least in part upon a length of the data and an end position of the first symbol string code; and combine the first symbol string code and the second symbol string code into a compressed data code.

31. The apparatus of claim 30, wherein said computing platform is further configured to run length code the one or more second positions of the second symbol string.

32. The apparatus of claim 30, wherein the first position of the second symbol string is determined by subtracting the length of the data from the end position of the first symbol string code to bring a current position back within the length of the data.

33. The apparatus of claim 30, wherein the first position of the second symbol string is determined by subtracting the length of the data from the end position repeatedly until a current position is brought back within the length of the data.

34. The apparatus of claim 30, wherein the length of the data comprises a total length of a grouping which includes the data.

35. The apparatus of claim 30, wherein the length of the data comprises a number of positions in the data which are not yet coded.

36. A method comprising:

generating a first symbol string code indicative of one or more first positions of a first symbol string within data to be compressed;

generating a second symbol string code if an end position of the first symbol string code is beyond a length of the data, wherein a first position of the second symbol string code is based at least in part on a number of positions of the end position beyond the length of the data; and combining the first symbol string code and the second symbol string code into a compressed data code.

37. An apparatus comprising:

a computing platform, said computing platform being configured to read data that has been compressed by a method comprising generating a first symbol string code indicative of one or more first positions of a first symbol string within the data to be compressed;

generating a second symbol string code indicative of one or more second positions of a second symbol string within the data, wherein a first position of the second symbol string is based at least in part on a length of the data and the first symbol string code; and combining the first symbol string code and the second symbol string code into a compressed data code.

* * * * *